(12) United States Patent
Osecky et al.

(10) Patent No.: US 6,532,151 B2
(45) Date of Patent: Mar. 11, 2003

(54) METHOD AND APPARATUS FOR CLEARING OBSTRUCTIONS FROM COMPUTER SYSTEM COOLING FANS

(75) Inventors: Benjamin D. Osecky, Fort Collins, CO (US); Blaine D. Gaither, Fort Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/775,164

(22) Filed: Jan. 31, 2001

(65) Prior Publication Data

US 2002/0101714 A1 Aug. 1, 2002

(51) Int. Cl.[7] .................................................. H05K 7/20
(52) U.S. Cl. ....................... 361/687; 361/695; 165/225; 415/98
(58) Field of Search ................................ 165/224, 225, 165/86, 80.3; 415/173.6, 129, 26, 98; 361/687, 695, 694; 340/584; 126/299

(56) References Cited

U.S. PATENT DOCUMENTS

| | | | | | |
|---|---|---|---|---|---|
| 4,352,349 A | * | 10/1982 | Yoho | ........................ | 126/299 |
| 6,020,820 A | * | 2/2000 | Chiang | ........................ | 340/584 |
| 6,023,402 A | * | 2/2000 | Kaminski | ................... | 361/103 |
| 6,276,900 B1 | * | 8/2001 | Lyszkowski et al. | ......... | 417/2 |

* cited by examiner

Primary Examiner—Darren Schuberg
Assistant Examiner—Hung Van Duong
(74) Attorney, Agent, or Firm—David A. Plettner

(57) ABSTRACT

An obstruction is removed from a computer system cooling fan by manipulating fan rotation. When a fan obstruction is detected, the fan is stopped. If the obstruction is caused by an object that was drawn toward the fan intake, such as a sheet of paper, this operation may clear the obstruction. The fan may also be reversed to attempt to blow the obstruction clear of the fan. Thereafter, the fan is returned to normal operation and is monitored to determine whether the obstruction was removed. If the fan is still obstructed, these steps can be repeated. If the attempts to clear the obstruction are unsuccessful, then the computer system operator or management software can be signaled.

30 Claims, 2 Drawing Sheets

METHOD AND APPARATUS FOR CLEARING OBSTRUCTIONS FROM COMPUTER SYSTEM COOLING FANS

CROSS REFERENCE TO RELATED APPLICATION

This application contains subject matter related to a co-pending application Ser. No. 09/775,404 entitled "A Method and Apparatus for Providing Continued Operation of a Multiprocessor Computer System after Detecting Impairment of a Processor Cooling Device" by Benjamin D. Osecky et al. This application is hereby incorporated by reference, is assigned to the same assignee as the present application, and was filed on Jan. 31, 2001, which is also the date on which the present application was filed.

FIELD OF THE INVENTION

The present invention relates to cooling fans in computer systems. More specifically, the present invention relates to detecting that a cooling fan is obstructed, and clearing the obstruction by manipulating the speed and direction of the cooling fan.

DESCRIPTION OF THE RELATED ART

In the art of computing, it is desirable to maximize the availability of a computer system. This is known in the art as high availability (HA) computing. Companies desiring to market HA computing systems have set very high goals. For example, Hewlett-Packard Company has announced a goal of achieving 99.999% availability for high-end server platforms. This translates to about five minutes of downtime per year.

The design of an HA computer encompasses many of the computer's subsystems. For example, redundant and uninterruptible power supples, error correcting memories, disk array subsystems, and robust software are all critical to the design of an HA computer system.

Even if it is not critical that a computer system have a high rate of availability (e.g., a desktop workstation), it is still desirable that the computer system be as robust as possible. Therefore, over time many methods and techniques that are originally deployed in HA computer systems become practical and cost-effective in other types of computer systems.

In most computer systems, cooling is an important function. Cooling is often provided by fans. A typical computer system may have one or more fans that draw air through the computer case and the power supply. In addition, small turbo cooler fans (which are also known as CPU fans) are often used to cool devices within the computer case, such as the central processing units (CPUs), motherboard chipset integrated circuits (ICs), or graphic device processors. One popular line of turbo cooler fans is the ArctiCooler family of turbo cooler fans, which are a product of Agilent Technologies, Inc. Of course, turbo cooler fans are also available from many other companies.

On problem associated with cooling fans is that is possible that an obstruction may block airflow through the fan. Consider, for example, what may happen if an operator temporarily places one or more sheets of paper on top of a computer system. A small draft could blow one of the sheets of paper toward the rear of the computer system, where the paper could be drawn toward an air intake of the system and obstruct the intake. Accordingly, the temperature within the computer system would begin to increase, and the computer system may fail. Other objects may also obstruct an air intake, such as leaves, insects, or dust.

It is also possible that a turbo cooler fan within the computer system case may become obstructed. For example, many computer systems have labels affixed to the inside of the computer case using an adhesive backing. Over time, the adhesive backing may fail, and the label may become detached. If the label were to be drawn into a turbo cooler fan and completely obstruct the fan, the temperature of the CPU would begin to rise and the CPU would fail. In addition, it is common to operate computer systems for extended periods of time with the case cover removed, in which case it is also possible that an external object, such as a sheet of paper or a leaf, could enter the case and obstruct the turbo cooler fan. To maximize the availability of any computer system that uses computer fans, it would be desirable if such an obstruction could be cleared using a simple and inexpensive method.

SUMMARY OF THE INVENTION

The present invention allows a computer system to attempt to remove a cooling fan obstruction by manipulating fan rotation. When the present invention detects that the fan is obstructed, the fan is stopped. If the obstruction is caused by an object that was drawn toward the fan intake, such as a sheet of paper, this operation may clear the obstruction. The fan may also be reversed to attempt to blow the obstruction clear of the fan. Thereafter, the fan is returned to normal operation and is monitored to determine whether the obstruction was removed. If the fan is still obstructed, these steps can be repeated. If the attempts to clear the obstruction are unsuccessful, then the computer system operator or management software can be signaled.

The present invention may be implemented with varying degrees of sophistication. In a very simple configuration, the present invention could be completely contained within a "smart fan". Such a fan could include appropriate logic that would reverse the fan direction upon detecting a sudden increase in fan speed, with an audible alarm that alerts the operator of an obstruction that can not be cleared. Similarly, a power supply could incorporate the present invention to attempt to clear an obstruction from the air intake of the supply. These relatively simple implementations have the advantage of being able to be incorporated into existing computer designs with little additional design effort. Accordingly, these implementations increase system reliability and robustness at little additional cost.

Alternatively, more sophisticated implementations can be coupled with system firmware and/or the operating system. For example, in one implementation, the operating system can be signaled to provide an orderly shutdown in the event of a failed attempt to clear an obstruction, and can be signaled to alert an operator of a successful obstruction removal so that the obstructing object can be removed from the vicinity of the fan. Even more sophisticated implementations are possible, such as coupling the present invention with a system that provides continued operation of a multiprocessor computer system after detecting impairment of a processor cooling device.

The present invention is very simple and inexpensive to implement. However, the present invention is very effective at clearing certain types of fan obstructions, thereby increasing system reliability, robustness, and availability.

DETAILED DESCRIPTION OF THE PREFERRED EMBODIMENTS

The present invention allows a computer system to attempt to remove a cooling fan obstruction by manipulating the rotational speed of the fan. In one configuration, the direction of the fan is also reversed. Quite simply, when the present invention detects that the fan is obstructed, the fan is stopped. If the obstruction is caused by an object that was drawn toward the fan intake, such as a sheet of paper, this operation may clear the obstruction. The fan may also be reversed to attempt to blow the obstruction clear of the fan. Thereafter, the fan is returned to normal operation and is monitored to determine whether the obstruction was removed. If the fan is still obstructed, these steps can be repeated. If the attempts to clear the obstruction are unsuccessful, then the computer system operator, or other management software, can be signaled. If it is not possible to continue operation of the computer system while the fan is obstructed, other steps may be taken, as described in greater detail below.

Figure 1:
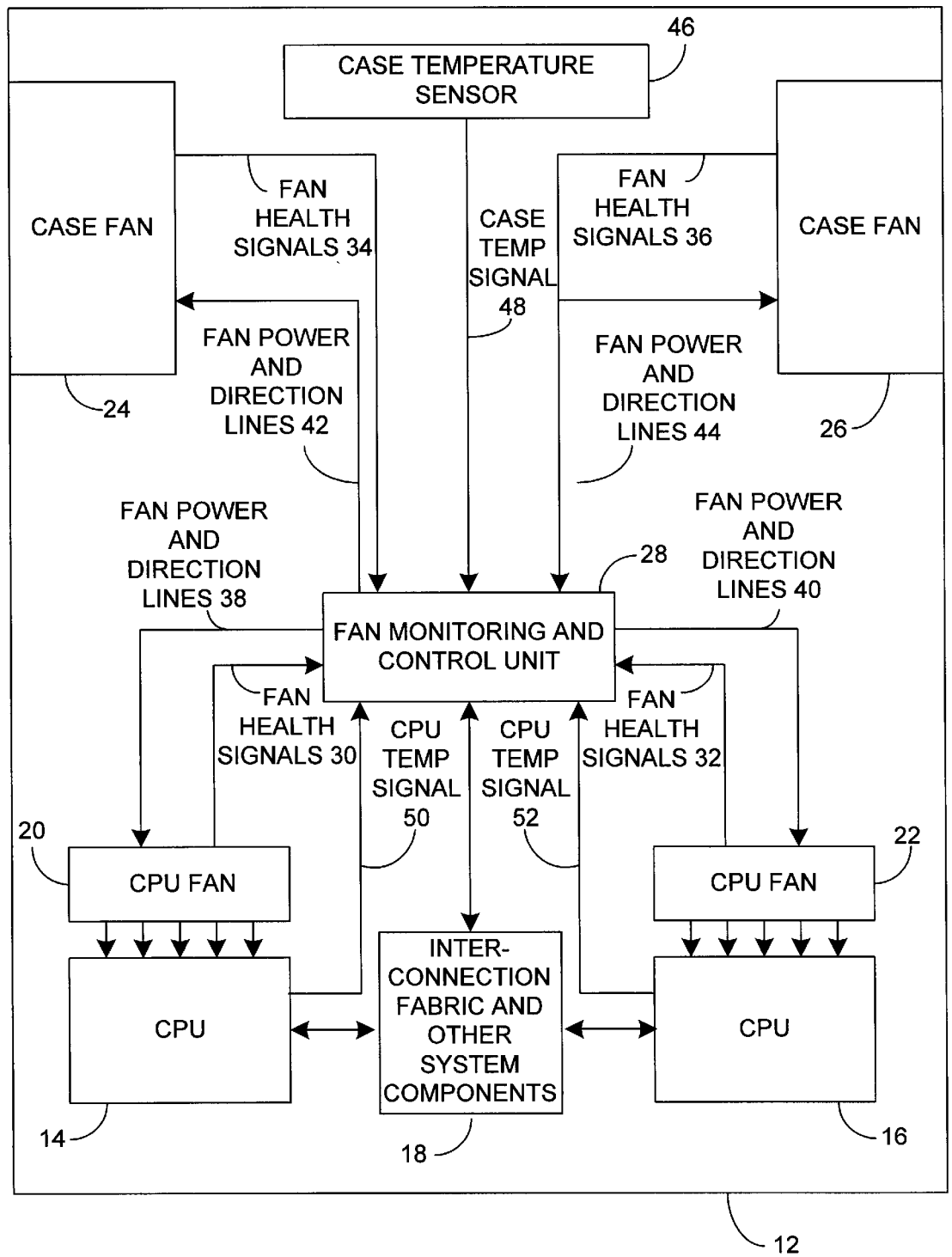
FIG. 1 is a block diagram of a computer system and illustrates the hardware components of the present invention.

The present invention is implemented via several hardware and software components. FIG. 1 is a block diagram of a computer system 10 that includes the hardware components of the present invention. Computer system 10 is enclosed in a case, which is represented by box 12. System 10 includes central processing units (CPUs) 14 and 16. Although system 10 is shown as having two CPUs, those skilled in the art will recognize that the present invention may be used in a computer system having any number of processors.

CPUs 14 and 16 are coupled to interconnection fabric and other system components 18. Typically the interconnection fabric will be provided by a motherboard that couples the CPUs to a chipset. However, other interconnections may be used, such as crossbar-based or ring-based interconnection fabrics. Interconnection fabric and other system components 18 also represents other devices commonly found in a computer system, such as memory, persistent storage, I/O units, and the like. However, these components need not be illustrated to understand the operation of the present invention.

In FIG. 1, CPU 14 is cooled by fan 20 and CPU 16 is cooled by fan 22. Furthermore, the interior of case 12 is cooled by case fans 24 and 26. Note that is at is also common to integrate a fan in a power supply to not only cool the power supply, but also remove air from the interior of the case. Although not shown in FIG. 1, such a power supply fan can also be used with the present invention.

Each of the fans shown in FIG. 1 are coupled to fan monitoring and control unit 28 by a series of fan power and direction lines and fan health signals. Accordingly, fan health signals 30, 32, 34, and 36 are coupled between fan monitoring and control unit 28 and fans 20, 22, 24, and 26, respectively, thereby allowing unit 28 to monitor the fan health signals to detect fan obstructions. In addition, fan power and direction lines 38, 40, 42, and 44 are coupled between unit 28 and fans 20, 22, 24, and 26, respectively. The fan power and direction lines not only provide power to the fans, but also provide measurement and control functions, as will be described below.

Fan monitoring and control unit 28 also monitors the temperatures of the CPUs and the temperature within the case. Accordingly, CPU temperature signals 50 and 52 are coupled between unit 28 and CPUs 14 and 16, respectively. In addition, case temperature sensor 46 is coupled to unit 28 via case temperature signal 48.

Fan monitoring and control unit 28 is also coupled to interconnection fabric and other system components 18 to allow the status of the fans to be observed by software routines, and to allow the obstruction clearing sequence to be controlled by software routines, which will be discussed in greater detail below.

Fan monitoring and control unit 28 can detect obstructions in a variety of ways. Note that one implementing the present invention may choose any one of these methods, or may choose a combination of methods.

One indication of an obstruction blocking a CPU fan is a rise in the temperature of the CPU itself. It is known in the art to integrate a temperature sensing device within the CPU, or to provide an external sensor in thermal contact with the CPU. CPU temperature signals 50 and 52 provide the temperatures of CPUs 14 and 16, respectively, to fan monitoring and control unit 28. Note that if the temperature device is integrated within the CPU, it may be necessary to retrieve the CPU temperature by executing an appropriate instruction sequence on the CPU.

Several temperature bands can be used. For example, if the CPU temperature is in a "green" temperature band, then the CPU can be considered to be operating normally. If the CPU temperature is in a higher "yellow" temperature band, then it can be assumed that the fan may be obstructed, and an attempt should be made to clear the obstruction. Finally, if the CPU temperature is in an even higher "red" temperature band, the CPU (and perhaps the whole computer system) should be powered down immediately to avoid the risk of damage or fire. Similarly, an indication of an obstruction blocking a case fan is a rise of the temperature within the case, and temperature bands can be also be used to trigger appropriate actions when case temperatures rise above normal levels.

The fan power and direction lines provide power from fan monitoring and control unit 28 to the fans. In addition, unit 28 can monitor the current supplied to each fan. A sudden change in measured fan current can also be an indication of an obstruction. In addition, unit 28 can manipulate the fan power and direction lines to attempt to clear an obstruction from a fan. If an obstruction is detected, the fan can be temporarily stopped to attempt to clear the obstruction. This could be effective, for example, if the fan airflow is perpendicular to or opposite from the force of gravity. Alternatively, if the fan direction is in the same direction as the force of gravity, the fan direction can be reversed to attempt to blow the obstruction clear of the fan. In addition, it may be desirable to operate the fan in the reverse direction at a higher speed, or pulse the fan in alternating directions to clear the obstruction. Of course, any fan known in the art can be stopped. Also, it is known in the art to design a fan that can operate at different speeds and is reversible. Accordingly, one skilled in the art would know how to adapt the teachings herein to design a fan appropriate for use with the present invention.

Note that it is common in the art to provide an array of fans in an "N+1" redundant configuration. The concept behind N+1 redundancy is that if N devices are needed to operate a system, N+1 devices are provided. If one of the devices fails, the failure is detected and the failed device can be replaced before one of the other devices fails. Accordingly, in an N+1 redundant fan array, if three fans are required, four fans are provided. Often these fans are adjacent to each other, so a single obstructing object may obstruct all the fans in the array, or just a subset of the fans. In such a configuration, it is desirable to simultaneously manipulate the fan power and direction lines of all the fans in the array using the same sequence, even if an obstruction is only detected at a subset of the fans. Reversing all fans in the array at the same time maximizes the chance that the obstruction will be blown clear from the array of fans.

The fan health signals represent any other type of fan health monitoring method that may be used with the present invention. For example, a fan tachometer may be used to measure the speed of the fan, with an increase in fan speed being used as an indication of an obstruction. The tachometer may be implemented with an optical sensor, a magnetic pickup, or any other technique known in the art.

The fan obstructions can also be monitored with an acoustic sensor. Such a sensor may comprise a microphone mounted proximate the fan and coupled to a signal processor that generates an acoustic profile of the fan during normal operation. Any detected deviation from the normal acoustic profile can be used as an indication of an obstruction. Of course, other types of signals may also be used, such as a signal that indicates the temperature or flow rate of air leaving the heat sink.

Note that fan monitoring and control unit 28 is coupled to interconnection fabric and other system components 18. This connection is shown to generically represent the ability of a program, which may reside in firmware or may be part of the operating system, to detect that a cooling fan is obstructed. Of course, this connection may be provided in many ways known in the art, such as memory-mapped address space, a DMA channel, an I$^2$C bus, a serial bus, a universal serial bus (USB), or other signaling method. Note that it is also possible for unit 28 to operate independently of the computer system, as will be described below.

As mentioned above, one implementing the present invention may choose any one of these obstruction-detecting methods, or may choose a combination of methods. Note that a combination of methods may provide additional advantages. For example, unit 28 can tolerate the failure any particular method (such as the fan speed sensor) by relying on other methods. If three or more methods are used, it is possible to detect an obstruction by "voting", with two or more sensors providing an indication of an obstruction before an attempt is made to clear the sensor. Of course, since it is a relatively simple matter to attempt to clear in obstruction in accordance with the present invention, such a complex method of determining whether a fan is obstructed may not be necessary.

Also note that different detection methods may be more appropriate for different type of blockages. For example, a sudden increase in fan speed may be consistent with a sheet of paper suddenly blocking a fan, while a gradual increase in temperature may be consistent with an air intake filter becoming clogged with dust, dirt, insects, or other types of matter. While reversing a fan may not completely clear an air intake filter of dust, it may provide partial relief. Accordingly, reversing a fan to clear an air intake filter, in combination with alerting an operator to clean the filter, may provide the difference between a computer system crashing or continuing operation without error.

Also note that the present invention may be provided in implementations having varying degrees of sophistication. In a very simple configuration, the present invention could be completely contained within a "smart fan". Such a fan could include appropriate logic that would reverse the fan direction upon detecting a sudden increase in air speed, and an audible alarm that alerts the operator of an obstruction. Similarly, a power supply could incorporate the present invention to attempt to clear an obstruction from the air intake of the supply. If the attempt to clear the obstruction was unsuccessful, the power supply could power down, thereby preventing damage and reducing the risk of a fire. In an even more sophisticated implementation, the present invention could be implemented substantially as shown in FIG. 1, except that fan monitoring and control unit 28 would not be linked to the operating system or system firmware. In this implementation, unit 28 could attempt to clear obstructions, and issue audio and/or visual alarms, but would otherwise not interact with the operating system.

The three relatively simple implementations discussed above have the advantage of being able to be incorporated into existing computer designs with little additional design effort. Accordingly, these implementations have the advantage of increasing system reliability and robustness at little additional cost.

Alternatively, more sophisticated implementations could be coupled with system firmware and/or the operating system. For example, in one implementation, fan monitoring and control unit 28 could signal the operating system (either using a program interface provided by system firmware or a platform specific driver) to perform an orderly shutdown in the event of a failure to clear an obstruction. Such an implementation could leverage off of existing implementations of uninterruptible power supplies that provided limited battery backup in the event of a power failure, and signal the operating system to perform an orderly shut down before cutting off power to the computer system.

In an even more sophisticated implementation, the present invention can be combined with other high availability design techniques. Incorporated by reference above is a co-pending application entitled "A Method and Apparatus for Providing Continued Operation of a Multi-processor Computer System after Detecting Impairment of a Processor Cooling Device" by Benjamin D. Osecky et al. This application teaches that the workload of one processor can be transferred to other processors after detecting the impending failure of a cooling device coupled to the processor, with the affected processor then being powered down or switched to a low power mode. The present invention can be combined with the teachings of this application to provide more reliability. Accordingly, the obstruction clearing technique of the present invention could be attempted before the affected processor is deallocated. If the obstruction is removed, then the processor can remain operational.

Alternatively, the obstruction clearing technique of the present invention could be attempted after the processor has been deallocated. This option has the advantage of allowing a longer and more thorough obstruction clearing sequence, such as alternatively reversing fan direction and altering fan speed several times. In addition, if it appears that the obstruction has been cleared, the fan could be operated for a period of time before the processor is restarted to ensure that the obstruction has actually been removed. In addition, an operator or management software can be signaled that an obstruction has been cleared. If an obstruction was cleared from a CPU fan, the object which caused the obstruction is most likely still present in the computer case, and should be removed.

Figure 2:
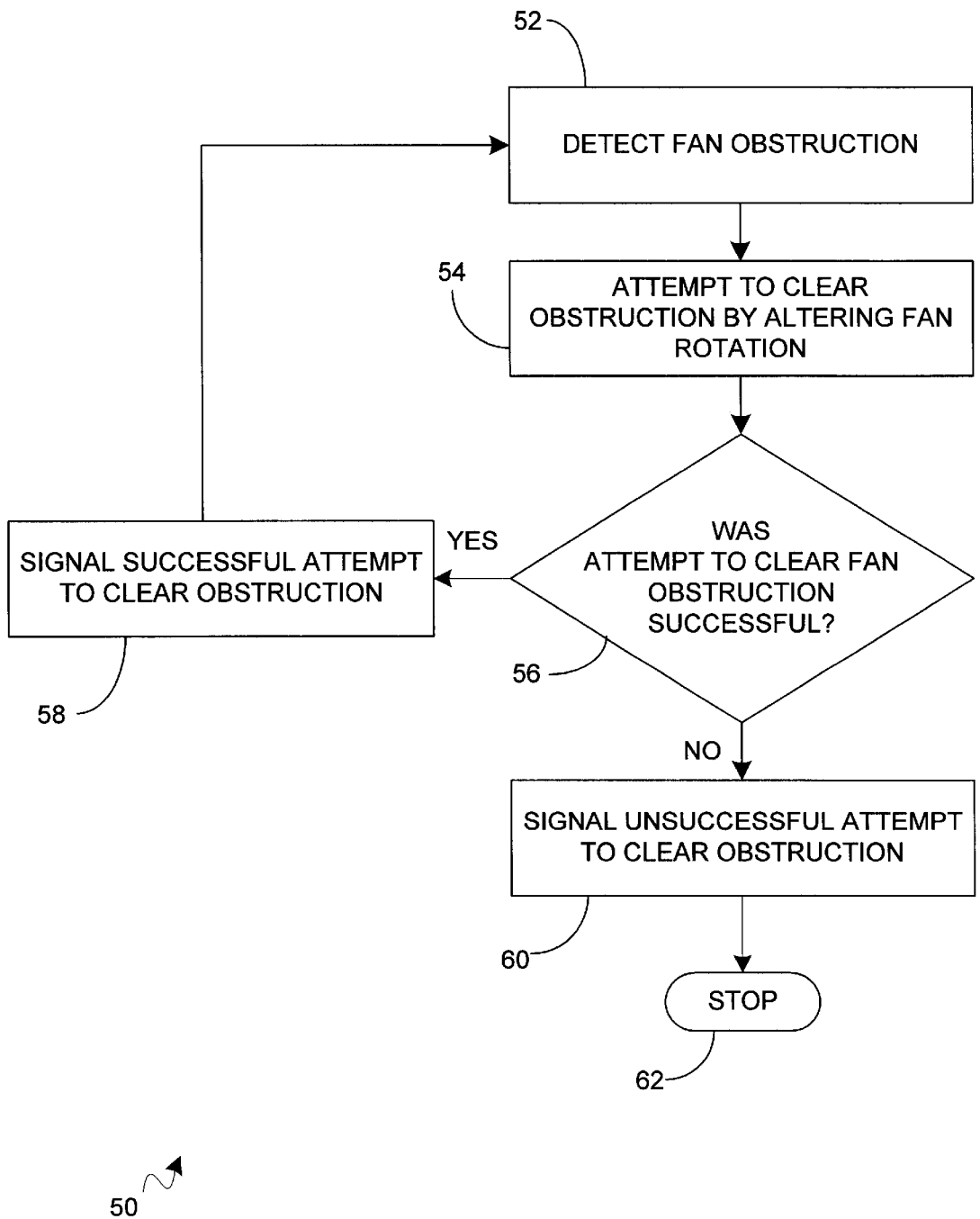
FIG. 2 is a flowchart illustrating the software components of the present invention.

FIG. 2 is a simple flowchart 50 illustrating the software components of the present invention. At block 52 of flowchart 50, a fan obstruction is detected. This can be accomplished using any of the methods described above, such as detecting a sudden change in fan speed or fan current, or a rise in temperature.

Next, control passes to block 54, where an attempt is made to clear the obstruction. This step can be as simple as stopping the fan, waiting a period of time, and restarting the fan. Alternatively, the fan direction can be reversed, and the fan speed can be increased. This sequence can be repeated several times to clear the obstruction, and the success of the attempts can be evaluated using the same methods that were used to initially detect the obstruction. Control then passes to decision block 56.

Decision block 56 determines whether the attempt to clear the fan obstruction was ultimately successful. If the fan obstruction was cleared, the "YES" branch is taken to block 58, which signals a successful attempt to clear the obstruction, and control passes back to block 52 to once again detect a fan obstruction. While signaling a successful attempt to clear the obstruction is optional, it may still be wise to do so. First, the obstructing object may still be proximate the affected fans or other fans, and should be removed from the area. Also, if the obstruction occurred within the case, it is possible that the obstructing object is now proximate a device that does not have a cooling fan, but still generates heat. For example, a detached label within the case may have been blown off a cooling fan, but may have landed on a memory module. While the memory module may not require a cooling fan, the obstructing object could still cause the memory module to become warmer than normal, and should therefore be removed.

Returning to decision block 56, if the attempt to clear the obstruction was not successful, the "NO" branch is taken to block 60. Block 60 signals the unsuccessful attempt to clear the obstruction. As discussed above, this signal may take many forms, such as an audio alarm or visual pop up window on a computer screen. In addition, the signal can be used to cause other actions to be performed, such as requesting an orderly shutdown of a computer system, powering down a power supply, or deallocating CPU. Note that if the affected fan is part of a redundant array of fans, it may be possible to continue operation of the computer system and simply signal the failure. Control than terminates at "STOP" block 62, because all available methods to clear the obstruction have failed. Note that at block 62, one implementing the present invention may choose to leave the fan powered up, or may choose to turn off the fan. At this point, the obstruction (or other problem that created a false indication of an obstruction) must be addressed in some other way, such as manually removing the obstruction. After the obstruction or other problem has been addressed, control can be passed back to block 52 by using another method, such as restarting the computer system if the system was powered down or clicking on a button in a visual pop up window represented by block 60.

At first impression, the present invention may appear to provide a minimal improvement in system reliability. However, such an impression masks the true importance of the invention. As discussed above, companies desiring to market HA computing systems have set very high goals. For example, Hewlett-Packard Company has announced a goal of achieving 99.999% availability for high-end server platforms. This translates to an unscheduled downtime budget of about five minutes of downtime per year. Accordingly, if a fan obstruction only brings down a single computer system in a large data center once every five years, this failure will still have a very large impact on the downtime budget, and may cost a customer, such as an on-line retailer, thousands of dollars.

Furthermore, the invention will cost very little to implement. Variable speed cooling fans capable of being reversed should cost little more than conventional cooling fans, and the control logic and software necessary to implement the present invention can be easily integrated into existing systems, such as uninterruptible power supply service routines or service processors in high-end computer systems.

Although the present invention has been described with reference to preferred embodiments, workers skilled in the art will recognize that changes may be made in form and detail without departing from the spirit and scope of the invention.

What is claimed is:

1. A method of attempting to remove an obstruction from a computer system fan without manual intervention by an operator comprising:
   detecting a fan obstruction;
   attempting to clear the fan obstruction by altering rotation of the computer system fan;
   returning the fan to substantially normal operation; and
   determining whether the attempt to clear the fan obstruction was successful.

2. The method of claim 1 wherein detecting a fan obstruction comprises detecting a change in rotational speed of the computer system fan.

3. The method of claim 1 wherein detecting a fan obstruction comprises detecting a change in current provided to the computer system fan.

4. The method of claim 1 wherein detecting a fan obstruction comprises detecting an increase in temperature at a point cooled by the computer system fan.

5. The method of claim 1 and further comprising:
   providing a signal to a system operator if the attempt to clear the obstruction was unsuccessful.

6. The method of claim 1 and further comprising:
   providing a signal to an operating system executing on the computer system if the attempt to clear the obstruction was unsuccessful, thereby allowing the operating system to take action to address the impaired computer system fan.

7. The method of claim 1 and further comprising:
   providing a signal to a system operator if the attempt to clear the obstruction was successful.

8. The method of claim 1 wherein attempting to clear the fan obstruction by altering rotation of the computer system fan comprises stopping the computer system fan and waiting a period of time.

9. The method of claim 1 wherein attempting to clear the fan obstruction by altering rotation of the computer system fan comprises reversing the computer system fan for a period of time.

10. The method of claim 1 wherein attempting to clear the fan obstruction by altering rotation of the computer system fan comprises reversing the computer system fan for a period of time and running the computer system fan in reverse at a higher than normal speed.

11. A computer system comprising:
   a CPU;
   a fan proximate the CPU, for cooling the CPU;
   a sensor configured to detect a fan obstruction; and
   a fan monitoring and control unit coupled to the fan and the sensor, wherein the fan monitoring unit detects a fan obstruction based on a signal from the sensor, attempts to clear the obstruction by altering rotation of the fan, returns the fan to substantially normal operation, and determines whether the attempt to clear the fan obstruction was successful.

12. The computer system of claim 11 wherein the sensor is a rotational speed sensor, and the fan monitoring and control unit detects a fan obstruction by detecting a change in the rotational speed of the fan.

13. The computer system of claim 11 wherein the sensor is a fan current sensor, and the fan monitoring and control unit detects a fan obstruction by detecting a change in current provided to the fan.

14. The computer system of claim 11 wherein the sensor is a temperature sensor that senses CPU temperature, and the fan monitoring and control unit detects a fan obstruction by detecting an increase in CPU temperature.

15. The computer system of claim 11 wherein the fan monitoring and control unit provides a signal to a system operator if the attempt to clear the obstruction was unsuccessful.

16. The computer system of claim 11 wherein the fan monitoring and control unit is coupled to the CPU and provides a signal to an operating system executing on the computer system if the attempt to clear the obstruction was unsuccessful, thereby allowing the operating system to take action to address the impaired fan.

17. The computer system of claim 11 wherein the fan monitoring and control unit provides a signal to a system operator if the attempt to clear the obstruction was successful.

18. The computer system of claim 11 wherein the fan monitoring and control unit attempts to clear the fan obstruction by stopping the fan and waiting a period of time.

19. The computer system of claim 11 wherein the fan monitoring and control unit attempts to clear the fan obstruction by reversing the fan for a period of time.

20. The computer system of claim 11 wherein the fan monitoring and control unit attempts to clear the fan obstruction by reversing the fan for a period of time and running the fan in reverse at a higher than normal speed.

21. A computer system comprising:
   a case;
   a CPU within the case;
   a fan positioned to remove warm air from the case;
   a sensor configured to detect a fan obstruction; and
   a fan monitoring and control unit coupled to the fan and the sensor, wherein the fan monitoring unit detects a fan obstruction based on a signal from the sensor, attempts to clear the obstruction by altering rotation of the fan, returns the fan to substantially normal operation, and determines whether the attempt to clear the fan obstruction was successful.

22. The computer system of claim 21 wherein the sensor is a rotational speed sensor, and the fan monitoring and control unit detects a fan obstruction by detecting a change in rotational speed of the fan.

23. The computer system of claim 21 wherein the sensor is a fan current sensor, and the fan monitoring and control unit detects a fan obstruction by detecting a change in current provided to the fan.

24. The computer system of claim 21 wherein the sensor is a temperature sensor that senses temperature inside the case, and the fan monitoring and control unit detects a fan obstruction by detecting an increase in temperature within the case.

25. The computer system of claim 21 wherein the fan monitoring and control unit provides a signal to a system operator if the attempt to clear the obstruction was unsuccessful.

26. The computer system of claim 21 wherein the fan monitoring and control unit is coupled to the CPU and provides a signal to an operating system executing on the computer system if the attempt to clear the obstruction was unsuccessful, thereby allowing the operating system to take action to address the impaired fan.

27. The computer system of claim 21 wherein the fan monitoring and control unit provides a signal to a system operator if the attempt to clear the obstruction was successful.

28. The computer system of claim 21 wherein the fan monitoring and control unit attempts to clear the fan obstruction by stopping the fan and waiting a period of time.

29. The computer system of claim 21 wherein the fan monitoring and control unit attempts to clear the fan obstruction by reversing the fan for a period of time.

30. The computer system of claim 21 wherein the fan monitoring and control unit attempts to clear the fan obstruction by reversing the fan for a period of time and running the fan in reverse at a higher than normal speed.

* * * * *